June 2, 1959

R. L. CROSBY 2,889,468

BINARY-CODED DECADE COUNTER

Filed March 14, 1955

INVENTOR

ROBERT L. CROSBY

BY

Cushman, Darby & Cushman

ATTORNEYS 2,889,468

BINARY-CODED DECADE COUNTER

Robert L. Crosby, Watertown, Mass., assignor to Sperry Rand Corporation, New York, N.Y., a corporation of Delaware Application March 14, 1955, Serial No. 494,093

26 Claims. (Cl. 307—88.5)

This invention pertains in general to trigger circuits and more specifically to bistable trigger circuits or flip-flops employing a single transistor of the current multiplication type.

Current multiplication is a phenomenon exhibited by most transistors of the point-contact type. Transistors possessing this property have a certain range over which increments of current applied to the emitter electrode produce correspondingly larger increments of current in the collector electrode. The emitter current vs. emitter voltage characteristic of such a transistor has a negative slope in this region of current multiplication, which region is bounded on either side by regions of positive slope with which it is continuous.

It is well known that circuits comprising a single transistor of the current multiplication type may be made to have two distinct stable states. In order to achieve bistable operation, it is necessary to provide a resistive load in the emitter circuit such that the emitter load line intersects the emitter characteristic at three points, one in each region. The intersections in the regions of positive slope are stable while the intersection in the negative resistance region is unstable. To switch from one state of stable equilibrium to the other, it is necessary to shift the emitter load line so that it intersects the emitter characteristic only in the other region of positive slope. Shifting of the load line may be accomplished by the application of pulses to the emitter, a positive pulse switching the transistor to one state and a negative pulse returning it to the other. These two states of stable equilibrium are characterized by the flow of current in the collector electrode. In one state the collector current remains at a constant, very small value which is virtually independent of changes in emitter current, and the transistor is said to be in the collector-current cutoff state. In the other condition of equilibrium, a relatively large current is flowing in the collector electrode. Since the emitter-to-collector current gain is essentially zero, the transistor is said to be current saturated. The resultant variation in D.C. voltage level at the collector electrode may be used to indicate the state of the transistor.

It has been discovered that the point-contact transistor has the property of "signal inversion" between the emitter and base electrodes so that a positive pulse applied to the base has the same effect as the application of a negative pulse to the emitter. Hence, a positive pulse applied to the emitter may switch the state of the transistor, and a succeeding positive pulse may return it to its original state if that pulse is steered to the base electrode. A bistable circuit in which a single transistor serves as the sole active element may thus be triggered from either stable state to the other if suitable means are available for steering alternate trigger pulses to the base and the emitter. A circuit satisfying this condition may function as "scale of two" circuit or binary counter stage or more basically as a flip-flop.

A flip-flop or bistable multivibrator finds a variety of uses in electronic data handling apparatus, both as a memory and in control functions such as the enabling means for a gate. The conventional flip-flop of the Eccles-Jordan configuration or a modification thereof uses two vacuum tubes. Because of their extensive application, the flip-flops by themselves in toto require an enormous number of vacuum tubes in a modern electronic computing system with consequent heavy power consumption, large heat dissipation and a corresponding complexity in circuitry. Accordingly, considerable effort has been made to simplify flip-flop circuits, and a number of flip-flop circuits based on both one and two transistors have been devised. While some of the single transistor flip-flops can be alternatively switched by a trigger pulse, each such device heretofore disclosed involves certain difficulties such as a dependence on particular pulse wave shapes or the requirement of vacuum-tube impedance matching devices or other complicated circuitry. These tend to defeat the advantages of simplicity and economy of a single transistor circuit and in certain cases limit the frequency response below the inherent capabilities of the transistor.

It is accordingly an object of this invention to provide a circuit for triggering a single transistor of the current multiplication type.

It is a further object of this invention to provide a flip-flop circuit based upon a single transistor which may be triggered by positive-going pulses.

It is another object of this invention to provide a single transistor flip-flop which may be triggered by negative pulses.

While a conventional Eccles-Jordan type flip-flop is symmetrical, a single transistor flip-flop embodying this invention is unsymmetrical in the sense that its setting is manifested only by the D.C. voltage level of the collector electrode. Accordingly, it is an object of this invention to adapt a non-symmetrical flip-flop to electronic components previously requiring a symmetrical flip-flop.

Further objects of the invention are set forth with particularity in the following detailed description and in the appended claims. Representative embodiments will best be understood from the following description with reference to the accompanying drawings, in which:

Figures 1, 2, 3, 4:
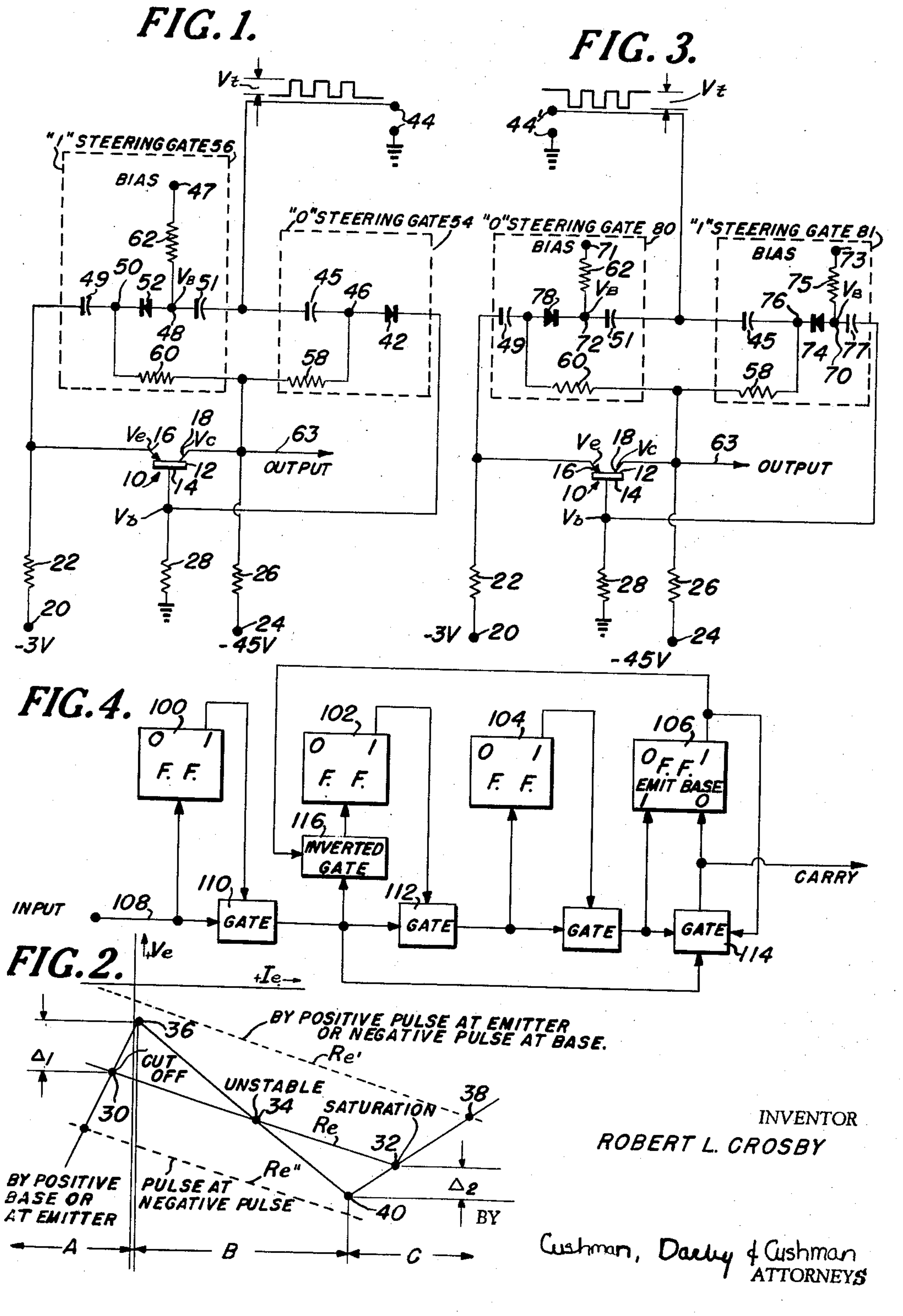
Figure 1 is a schematic diagram of a single transistor flip-flop according to the invention which is triggered from a source of positive pulses.
Figure 2 is a straight line approximation of the current-voltage characteristic and the emitter load line of a circuit similar to Figure 1.
Figure 3 is a schematic diagram of a single transistor flip-flop according to the invention which is switched by negative trigger pulses.
Figure 4 is a block diagram of a binary-coded decade counter according to the invention which illustrates the manner in which a non-symmetrical flip-flop may be utilized in an electronic data handling system.

Point contact transistors may be classed into either the p-type or the n-type depending on the type of germanium material in the semi-conductive body. For convenience in describing and illustrating this invention, all transistors are of the n-type and the battery and rectifier polarities are chosen accordingly. The illustrated embodiments of the invention are not, however, limited to any particular type of transistor as long as the transistor is characterized by the phenomenon of current multiplication.

Referring now to the drawings, Figure 1 shows a current multiplication transistor 10 having an n-type semi-conductive body 12 to which ohmic contact is made by base electrode 14 and rectifying contact by emitter electrode 16 and collector electrode 18. The emitter electrode 16 is biased in the reverse direction by connection to a source of small negative potential at terminal 20 of perhaps three volts through "load line" resistor 22 which is selected so that the emitter load line characteristic intersects the emitter current-voltage characteristic at three points. A larger negative voltage at terminal 24 in the order of 45 volts is applied to the collector electrode 18 through current limiting resistor 26. A base resistor 28 is connected between the base electrode 14 and ground.

Reference is now made to Figure 2 which shows a straight line approximation of the current-voltage characteristic of the circuit of Figure 1. For descriptive purposes, the characteristic is divided into three regions: positive resistance regions A and C and negative resistance region B. It is seen that load line $R_e$ intersects the current-voltage characteristic to form stable points 30 in region A and 32 in region C and to form unstable point 34 in region B. If the transistor 10 is initially in its stable state of low current conduction, the emitter rests at a voltage graphically indicated by point 30 of Figure 2. A positive pulse of greater amplitude than $\Delta_1$ then raises the emitter voltage above the peak point 36 and so shifts the load line to the position $R_e'$. Because of the negative input impedance, the emitter current increases sharply to the point 38 in what is sometimes called a "snap action" and drops off to stable point 32 when the pulse is removed. A negative pulse of amplitude greater than $\Delta_2$ applied to the emitter causes the load line to pass below the valley point 40 to the position indicated by $R_e''$ in Figure 2. As the negative pulse diminishes in amplitude, the load line shifts back to the $R_e$ position, thereby causing the circuit to assume values characteristic of the starting point 30 in region A. It should be noted that because of the property of "signal inversion" inherent in point contact transistors, the load line may be shifted to its position $R_e'$ by a negative pulse applied at the base electrode 14 or to position $R_e''$ by a positive pulse at the base.

In order to switch the state of transistor 10 alternately between the conditions of collector current cutoff and saturation using a single source of trigger signals or pulses, it is necessary to take advantage of the different potentials at which the electrodes stabilize in the two conditions of equilibrium. For purposes of discussion, the pertinent electrode potentials may be represented as follows:

$V_{bs}$=Base voltage during current saturation.
$V_{cs}$=Collector voltage at current saturation.
$V_{bn}$=Base voltage at cutoff (non-saturation).
$V_{cn}$=Collector voltage at cutoff.

In an actual embodiment the following relationships may prevail:

$$V_{cs} \gg V_{cn} \quad (1)$$
$$V_{bs} > V_{cs} \quad (2)$$
$$V_{bn} \gg V_{cn} \quad (3)$$

where a double inequality may be taken to indicate a differential in the order of 15 to 30 volts.

Referring again to Figure 1, it will be seen that the base and emitter electrodes 14 and 16 are connected, respectively, via steering gates 54 and 56 to a source of positive triggering pulses of voltage $V_t$ at terminals 44. Gates 54 and 56 may be of any of the numerous types known in the art and are illustrated and described as diode gates without limitation intended thereto. As shown, gate 54 comprises diode 42 connected at its cathode end to base 14 and at its anode end to junction 46 and further through coupling condenser 45 to the input terminals 44. Junction 46 is also connected through resistor 58 to the collector electrode 18 of transistor 10, the voltage of which controls (enables or disables) diode 42 with respect to the passage therethrough of the positive triggering pulses at terminals 44. Gate 56, as illustrated in Figure 1, is similarly composed with diode 52 being connected at its cathode end to junction 50 and further through blocking condenser 49 to the emitter electrode. Junction 50 also connects through current limiting resistor 60 to the collector electrode 18. The voltage of the collector electrode, in conjunction with a steady biasing voltage applied at terminal 47 through resistor 62 to junction 48 and thereby to the anode of diode 52, controls the passage of positive pulses from terminals 44 through diode 52, the anode of diode 52 being coupled to the input terminals via condenser 51.

Continuing to refer to Figure 1, suppose that transistor 10 is initially in the saturated state (graphically indicated as point 32 in Figure 2) so that diode 42 is biased to non-conduction due to the voltage differential between the base 14 and collector 18 according to Relationship 2 above. However, gate 54 and in particular diode 42 though biased to non-conduction is enabled at least to the extent that a positive pulse at trigger input 44, which is of sufficient amplitude to raise the potential at point 46 (i.e., the potential on the plate of diode 42) above that of the base electrode 14, reverses diode 42 to present a low forward impedance so that the positive pulse passes therethrough to the base electrode 14. This triggers the transistor to the cutoff state, assuming that the pulse which passes diode 42 is of sufficient amplitude to shift the load line, graphically speaking, below the valley point 40 of Figure 2. In switching from the saturated to the cutoff state, the base 14 undergoes very little change in voltage while the collector takes a relatively large negative swing as indicated by Expression 1. Accordingly, when transistor 10 is at cutoff, gate 54 is disabled since diode 42 is biased to non-conduction to the extent that positive trigger pulses at input 44 can no longer overcome that bias. If $V_t$ is the amplitude of a trigger pulse, inequality Relationship 2 may be rewritten as $$V_{bs} > V_{cs}$$

but $$V_{bs} < V_{cs} + V_t \quad (4)$$

and Relationship 3 may be rewritten as $$V_{bn} \gg V_{cn}$$

so that $$V_{bn} > V_{cn} + V_t \quad (5)$$

Hence, a positive pulse at trigger input 44 is applied to the base 14 if and only if the transistor 10 is in the current saturated condition of equilibrium.

In order to steer the positive trigger pulses to the emitter electrode 16 when transistor 10 is at cutoff, the bias voltage at terminal 47 should be chosen so that the voltage $V_B$ at point 48 is such that $$V_{cs} > V_B + V_t > V_{cn} \quad (6)$$

During current saturation the point 50 (the cathode end of diode 52) will then be at a more positive voltage than point 48 in the presence of a trigger pulse at input 44 so that the trigger pulse cannot pass diode 52 to reach the emitter 16, i.e., gate 56 is disabled since diode 52 is biased to non-conduction by $V_{cs}$ even in the presence of a triggering signal or pulse. However, when transistor 10 is at cutoff, gate 56 and in particular diode 52 though perhaps biased slightly to non-conduction is enabled at least to the extent that point 48 is more positive than point 50 at least during the application of a trigger pulse, and diode 52 passes the pulse to the emitter, triggering the transistor to the saturated state. It should be noted that the voltage $V_B$ is preferably slightly negative with respect to $V_{cs}$ so that diode 52 is normally not conducting, either during saturation or cutoff of transistor 10. This results both in a power saving and in longer life for the diode. However, the negative bias across diode 52 during transistor cutoff should be small compared to the amplitude of a trigger pulse so that the pulse is substantially not reduced in amplitude in passing through diode 52.

By arbitrarily defining the condition of collector current cutoff as the "0" state and the condition of current saturation as the "1" state, the transistor 10 of Figure 1 functions as the heart of a flip-flop circuit which may be switched between its two states by a succession of positive trigger pulses by virtue of "0" steering gate 54 and "1" steering gate 56. The collector electrode 18 has a usable difference in D.C. voltage levels corresponding to the two stable states and therefore may serve to feed a flip-flop output line 63. In that sense the flip-flop circuit may be thought of as non-symmetrical, as contrasted with flip-flops of the Eccles-Jordan type which have two output terminals.

Typical circuit values for Figure 1, with no limitation thereto being intended, are as follows:

$R_{22}$=680 ohms
$R_{24}$=4700 ohms
$R_{28}$=1000 ohms
$R_{58}$=10,000 ohms
$R_{60}$=10,000 ohms
$R_{62}$=10,000 ohms
Bias=22.5 volts Reference is now made to Figure 3 in which is shown a single transistor flip-flop circuit triggered from negative signals or pulses. Since negative pulses applied to the base of a transistor drive it to saturation while negative pulses at the emitter trigger it to cutoff, the mode of operation is reversed with respect to the positive input trigger circuit of Figure 1. Corresponding elements of Figure 1 which are similarly composed, utilized, and/or connected in Figure 3 are given like numbers. Junctions and terminals where voltage levels might differ are given new reference numerals. Gate 80 is similar to gate 56 of Figure 1 except diode 52 is reversed in connections, the cathode end of the reversed diode 78 being coupled through condenser 51 to a source of negative triggering pulses at input terminals 44' and being also connected to a biasing voltage at terminal 71 through resistor 62. The anode end of diode 78 is connected in the same manner as the cathode end of diode 52 of Figure 1. In gate 81 of Figure 3, the connections to the cathode end of diode 74 are the same as those to the anode of diode 42 of Figure 1. However, to the anode of diode 74, there is applied a steady biasing source of potential through resistor 75 from terminal 73. Condenser 77 blocks the biasing current but couples the anode of diode 74 to the base terminal 14 of transistor 10. Other connections in Figure 3 are similar to those in Figure 1.

Continuing to refer to Figure 3, if the bias voltage at terminals 71 and 73 are so chosen that $$V_{cs}>V_B>V_{cn} \qquad (7)$$

and $$V_{cs}+V_t>V_B \qquad (8)$$

where $V_B$ is the voltage at points 70 and 72, the following conditions prevail when the transistor 10 is in the saturated state. Gate 81 is disabled since diode 74 is biased non-conductively by $V_B$ and $V_{cs}$ so far that it remains in the non-conducting state even when the voltage at point 76 takes a negative swing as a result of a negative trigger pulse, according to Expression 8. Gate 80 is, in turn, enabled since diode 78 is biased into the conducting state by $V_{cs}$ being more positive than $V_B$ at point 72 and passes a negative pulse to the emitter electrode 16, switching the transistor to cutoff.

When in the cutoff state, the second inequality of Expression 7 is applicable and diode 78 is blocked while diode 74 passes a trigger pulse to the base. This switches transistor 10 back to current saturation. It should be noted that the bias across diode 78 must be so large that it is not overcome by the negative trigger, that is, $$V_B+V_t>V_{cn} \qquad (9)$$

The representative circuit values given for various components of Figure 1 apply equally to the corresponding components of Figure 3.

Because of its non-symmetrical nature, the utilization of a single transistor flip-flop of the types described above instead of a conventional Eccles-Jordan symmetrical flip-flop requires the exercise of invention. Referring now to Figure 4, there is shown a binary-coded signal decimal or decade counter composed of four single transistor flip-flops and five crystal diode gates. If the pulses to be counted are positive-going spikes, flip-flops 100, 102, and 104 are identical to the circuit of Figure 1 while flip-flop 106 is the circuit of Figure 1 less steering gates 54, 56, with the "1" input applied directly to the emitter 16 and the "0" input tied to the base 14.

The flip-flops are all initially in the "0" or cutoff state so that the first pulse on line 108 sets flip-flop 100 to its "1" state and its collector takes a positive swing to enable gate 110. However, since the transition time of a transistor is long compared to the duration of the pulse being counted, the first pulse is blocked by gate 110. It will be understood that gate 110 is similar to steering gate 56 of Figure 1 in that it will not pass a pulse when biased by the lower voltage of the collector electrode at cutoff but is enabled by the more positive voltage at saturation. The second pulse on line 108 returns flip-flop 100 to "0" and also passes through gate 110 but is stopped by disabled gates 112 and 114 which may be identical to gate 110. However, inverted gate 116 is similar to the "0" steering gate 80 of Figure 3 and so is enabled at a more negative voltage. Since flip-flop 106 is at cutoff, gate 116 is enabled to allow the second pulse to set flip-flop 102 to its "1" state.

It will be appreciated by those skilled in the art that the count proceeds in a normal manner until the ninth pulse on line 108 leaves flip-flops 100 and 106 in the "1" state and flip-flops 102 and 104 at "0." The tenth pulse then resets flip-flop 100, passes enabled gate 110, is blocked by gates 112 and 116, the latter being disabled by the now more positive collector of flip-flop 106, and passes gate 114 to reset flip-flop 106 to "0" and produce a "carry" pulse on output line 118. The flip-flops are now all in the "0" or cutoff state and ready to count another ten pulses.

It will be appreciated that the negative trigger circuit of Figure 3 is equally applicable to the decade counter of Figure 4. In addition either of the flip-flops of Figures 1 and 3 are adaptable to a wide variety of situations (e.g., simple storage registers, shift registers, binary counters, binary accumulators, etc.) and are within themselves susceptible to a number of modifications without departing from the concept of this invention. It is accordingly intended that the matter contained in the foregoing description and the appurtenant drawings be considered as illustrative and not limitative, the scope of the invention being defined in the appended claims.

What is claimed is:

1. A bistable transistor circuit which is adapted to be shifted from either of its stable operating states back to the other upon successive application of triggering signals of the same polarity, the circuit comprising a transistor having a collector electrode and two other electrodes, said collector electrode being capable of assuming two different potentials in accordance with the input to the other two electrodes, means for connetcing a source of triggering signals in parallel to said other two electrodes, and means coupling the collector electrode to said last mentioned means for utilizing one of said two different potentials at a given time to completely block one of said triggering signals from one of said two electrodes while said one signal is presented to the other electrode during said given time and for utilizing the other potential at another time to completely block another triggering signal from said other electrode while said another signal is presented to said one electrode during said another time.

2. A circuit as in claim 1 arranged to receive all positive triggering signals.

3. A circuit as in claim 1 arranged to receive all negative triggering signals.

4. A bistable transistor circuit which is adapted to be shifted from either of its stable operating states back to the other upon successive application of triggering signals of the same polarity, the circuit comprising a transistor having a collector electrode and two other electrodes, said collector electrode being capable of assuming two different potentials and each potential indicating a different stable state, one of said potentials being caused by an input to one of said other two electrodes and the other potential being caused by an input to the other of the two electrodes, means for connecting to a source of triggering signals of the same polarity, and gating means interconnecting the signal source connecting means and all three transistor electrodes for gating one of said triggering signals for one of said electrodes only in accordance with one of said potentials and for gating another triggering signal to another electrode only in accordance with the other of said potentials.

5. A circuit as in claim 4 arranged to receive all positive signals.

6. A circuit as in claim 4 arranged to receive all negative signals.

7. A bistable transistor circuit which is adapted to be shifted from either of its stable operating states back to the other upon being succesively triggered by signals of the same polarity, the circuit comprising a transistor having a collector electrode, an emitter electrode and a base electrode, a first gate and a second gate each connected to a source of signals of the same polarity, the first gate being further connected to said base electrode and the second gate being further connected to said emitter electrode so that each gate when enabled may pass a signal from said source to its respective electrode, said collector electrode assuming a first stable potential after the base electrode is triggered by one of said signals through said first gate and assuming a second stable potential after the emitter electrode is triggered by a signal next following said one signal through said second gate, and means coupling said control electrode to each of said gates for enabling said first gate to pass one of said signals and disabling the second gate by one of said potentials and for enabling the second gate to pass the next following signal and disabling said first gate by the other of said potentials.

8. A circuit as in claim 7 arranged to receive all positive signals.

9. A circuit as in claim 7 arranged to receive all negative signals.

10. A bistable transistor circuit which is adapted to be shifted from either of its stable operating states back to the other upon being succesively triggered by signals of the same polarity, the circuit comprising a transistor having a collector electrode, an emitter electrode, and a base electrode, a first diode and a second diode each connected to a source of signals of the same polarity, the first diode being further connected to said base electrode and the second diode being further connected to said emitter electrode, each diode being polarized to pass a signal from said source to its respective electrode, said collector electrode assuming a first stable potential after the base electrode is triggered by one of said signals through said first diode and assuming a second stable potential after the emitter electrode is triggered by a signal next following said one signal through said second diode, and means coupling said collector electrode to each of said diodes for biasing the first diode to pass said one of said signals and biasing the second diode to non-conduction by said second potential and for biasing the second diode to pass the next following signal and biasing the first diode to non-conduction.

11. A circuit as in claim 10 arranged to receive all positive signals.

12. A circuit as in claim 10 arranged to receive all negative signals.

13. A bistable transistor circuit which is adapted to be shifted from either of its stable operating states back to the other upon being succesively triggered by positive signals, the circuit comprising a transistor having a collector electrode, an emitter electrode, and a base electrode, an input for receiving the positive triggering signals, a first diode having its plate coupled to the input and its cathode connected to said base electrode, a second diode coupled at its plate to the input and at its cathode to said emitter electrode, the plate of said first diode and the cathode of said second diode each being further connected to the collector electrode, and a constant biasing potential coupled to the plate of said second diode, the arrangement being such that each succeeding positive triggering signals causes the transistor to shift from one stable state to another stable state, the voltage level at the collector electrode being indicative of the operating state and when at its larger value biasing said second diode to non-conduction but biasing said first diode to a condition such that the addition of a positive triggering signal causes a conduction of the first diode permitting the application of the positive signal to said base electrode and when at its smaller value biasing said first diode to non-conduction but biasing said second diode to a condition such that the addition of a positive triggering signal causes conduction of the second diode permitting the application of the positive signal to said emitter electrode.

14. A bistable transistor circuit which is adapted to be shifted from either of its stable operating states back to the other upon being successively triggered by negative signals, the circuit comprising a transistor having a collector electrode, an emitter electrode, and a base electrode, an input for receiving the negative triggering signals, a first diode having its cathode coupled to the input and its plate connected to said base electrode, a second diode coupled at its cathode to the input and at its plate to said emitter electrode, the cathode of said first diode and the plate of said second diode each being further connected to the collector electrode, a first constant biasing potential coupled to the plate of said first diode, and a second constant biasing potential coupled to the cathode of said second diode, the arrangement being such that each succeeding negative triggering signal causes the transistor to shift from one stable state to another stable state, the voltage level at the collector electrode being indicative of the operating state and when at its larger value biasing said first diode to non-conduction but biasing said second diode to conduction permitting application of the negative signal to the emitter electrode and when at its smaller value biasing said second diode to non-conduction but biasing said first diode at least to a condition such that the addition of a negative triggering signal causes conduction of the first diode permitting application of the negative signal to said base electrode.

15. A bistable transistor circuit which is adapted to be shifted from either of its stable operating states back to the other upon successive application of triggering signals of the same polarity, the circuit comprising a transistor having a collector electrode and two other electrodes, said collector electrode being capable of assuming two different potentials and each potential indicating a different stable state, one of said potentials being caused by an input on one of said other two electrodes and the other potential being caused by an input on the other of the two electrodes, means for connecting to a source of triggering signals of the same polarity, and gating means interconnecting the signal source connecting means and all three transistor electrodes for gating one of said triggering signals to one of said electrodes in accordance with one of said potentials which prevents said one signal from being presented at all to the other electrode and for gating another triggering signal to another of said electrodes in accordance with the other of said potentials which prevents said other signal from being prevented at all to said one electrode.

16. A bistable transistor circuit which is adapted to be shifted from either of its stable operating states back to the other upon successive application of triggering signals of the same polarity, the circuit comprising a transistor having a collector electrode and two other electrodes, and two gating means each connected to a different one of the two other electrodes for passing said triggering signals thereto when enabled, said collector electrode assuming a first potential indicative of one stable state when triggered by a signal on one of the other electrodes and assuming a second potential indicative of the other stable state when triggered by a signal on the other of said two other electrodes, said first potential operating to enable one of said gating means and to disable the other gating means, said second potential operating to disable said one gating means and to enable the other, the arrangement being such that a triggering signal passing through said one gating means when enabled by the first potential causes said transistor to shift its state to effect said second collector potential which disables said one gating means and enables said other gating means to allow a successive triggering signal to pass the other gating means and shift said transistor to its other state to effect said first collector potential which then disables said other gating means.

17. A bistable transistor circuit which is adapted to be shifted from either of its stable operating states back to the other upon being successively triggered by signals of the same polarity, the circuit comprising a transistor having a collector electrode, an emitter electrode and a base electrode, a first gate and a second gate each connected to a source of signals of the same polarity, the first gate being further connected to said base electrode and the second gate being further connected to said emitter electrode so that each gate when enabled may pass a signal from said source to its respective electrode, said collector electrode assuming a first stable potential after the base electrode is triggered by one of said signals through said first gate and assuming a second stable potential after the emitter electrode is triggered by a signal next following said one signal through said second gate, and means coupling said second electrode to each of said gates for enabling said first gate to pass one of said signals and disabling the second gate by said second potential and for enabling the second gate to pass the next following signal and disabling said first gate by the first potential.

18. A bistable transistor circuit which is adapted to be shifted from either of its stable operating states back to the other upon successive application of triggering signals of the same polarity, the circuit comprising a single transistor having a collector electrode and two other electrodes, said collector electrode being capable of assuming two different potentials in accordance with the input to the other two electrodes, and means for connecting a source of triggering signals in parallel to said other two electrodes, said collector electrode being coupled to said last mentioned means, the arrangement being such that the two different potentials of the collector electrode permit the triggering signals to be presented to the other two electrodes alternately.

19. A bistable transistor circuit which is adapted to be shifted from either of its stable operating states back to the other upon successive application of triggering signals of the same polarity, the circuit comprising a single transistor having a collector electrode and two other electrodes, said collector electrode being capable of assuming two different potentials and each potential indicating a different stable state, one of said potentials being caused by an input on one of said other two electrodes and the other potential being caused by an input on the other of the two electrodes, means for connecting to a source of triggering signals of the same polarity, and gating means interconnecting the signal source connecting means and all three transistor electrodes, the arrangement being such that one of said collector electrode potentials gates a triggering signal to one of said other two electrodes causing the collector electrode to asume its other potential which gates a successive triggering signal, if any, to the other of said two electrodes and shifts the collector potential back to its other value.

20. A bistable transistor circuit which is adapted to be shifted from either of its stable operating states back to the other upon successive application of triggering signals of the same polarity, the circuit comprising a single transistor having a collector electrode and two other electrodes, and two gating means each connected to a different one of the two other electrodes for passing said triggering signals thereto when enabled, said collector electrode assuming a first potential indicative of one stable state when triggered by a signal on one of the other electrodes and assuming a second potential indicative of the other stable state when triggered by a signal on the other of said two other electrodes, said first and second potentials enabling respectively the two gating means, the arrangement being such that the triggering signal passing through one gating means induces one of the collector potentials which then disables said one gating means and enables the other gating means to allow a successive triggering signal to pass through the latter gating means.

21. A bistable transistor circuit which is adapted to be shifted from either of its stable operating states back to the other upon being successively triggered by signals of the same polarity, the circuit comprising a single transistor having a collector electrode, an emitter electrode and a base electrode, a first gate and a second gate each connected to a source of signals of the same polarity, the first gate being further connected to said base electrode and the second gate being further connected to said emitter electrode so that each gate when enabled may pass a signal from said source to its respective electrode, said collector electrode assuming a first stable potential when the base electrode is triggered by one of said signals through said first gate and assuming a second stable potential when the emitter electrode is triggered by a signal next following said one signal through said second gate, the arrangement being such that said second potential disables the second gate but enables the first gate to pass said one of said signals and the first potential disables the first gate but enables the second gate to pass the next following signal.

22. A bistable transistor circuit which is adapted to be shifted from either of its stable operating states back to the other upon being successively triggered by signals of the same polarity, the circuit comprising a single transistor having a collector electrode, an emitter electrode, and a base electrode, a first diode and a second diode each connected to a source of signals of the same polarity, the first diode being further connected to said base electrode and the second diode being further connected to said emitter electrode, each diode being polarized to pass a signal from said source to its respective electrode, said collector electrode assuming a first stable potential when the base electrode is triggered by one of said signals through said first diode and assuming a second stable potential when the emitter electrode is triggered by a signal next following said one signal through said second diode, the arrangement being such that said second potential biases the second diode to non-conduction but biases the first diode to pass said one of said signals and the first potential biases the first diode to non-conduction but biases the second diode to pass the next following signal.

23. In a signal decade counter, three bistable transistor circuits, each as in claim 18 with each having its own input terminal for receiving triggering signals, a fourth bistable single transistor circuit having a collector electrode and first and second input electrodes and operating to shift from one stable operating state back to another stable operating state upon receiving successive triggering signals of the same polarity alternately at said first and second input electrodes, a set of four gates each connected to a different one of the four collector electrodes for enablement only when its respective transistor circuit is in one of its stable states, an inverted gate connected to the collector electrode of the fourth transistor circuit for enablement only when said fourth transistor circuit is in its other stable operating state, three of said four gates being connected serially and the fourth and inverted gate being connected in parallel with the input to the second of the three serially connected gates with the output of the inverted gate being coupled to the input terminal of the transistor circuit which controls the second gate, the output of the second gate being coupled to the input terminal of the transistor circuit which controls the third gate, the output of the third gate enabling the fourth gate and being coupled to the first input electrode of the fourth transistor circuit the output of the fourth gate being coupled to the second input electrode of the fourth transistor circuit, and means for coupling a source of serially occurring input signals to be counted to the first in line of said three serially connected gates and to the input terminal of the transistor circuit whose collector electrode is connected to the first gate, the arrangement being such that said fourth gate passes only every tenth input signal.

24. Apparatus as in claim 23 arranged to receive and count all positive signals.

25. Apparatus as in claim 23 arranged to receive and count all negative signals.

26. A signal decade counter comprising three bistable transistor circuits each as in claim 1 with each having its own input terminal for receiving triggering signals, a fourth bistable single transistor circuit having a collector electrode and first and second input electrodes and operating to shift from one stable operating state back to another stable operating state upon receiving successive triggering signals of the same polarity alternately at said first and second input electrodes, a set of four gates each connected to a different one of the four collector electrodes for enablement only when its respective transistor circuit is in one of its stable states, an inverted gate connected to the collector electrode of the fourth transistor circuit for enablement thereby, three of said four gates being connected serially output to input with the fourth and inverted gate being connected in parallel with the input to the second of the three serially connected gates, the output of the inverted gate being coupled to the input terminal of the transistor circuit which controls the second gate, the output of the second gate being coupled to the input terminal of the transistor circuit which controls the third gate, the output of the third gate enabling the fourth gate and being coupled to the first input electrode of the fourth transistor circuit, the output of the fourth gate being coupled to the second input electrode of the fourth transistor circuit, and means for coupling a source of serially occurring input signals to be counted to the first in line of said three serially connected gates and to the input terminal of the transistor circuit whose collector electrode is connected to the first gate, the arrangement being such that said fourth gate passes only every tenth input signal.

References Cited in the file of this patent

UNITED STATES PATENTS

| | | |
|---|---|---|
| 2,536,808 | Higinbotham | Jan. 2, 1951 |
| 2,595,208 | Bangert | Apr. 29, 1952 |
| 2,644,897 | Lo | July 7, 1953 |
| 2,662,983 | Gordon | Dec. 15, 1953 |
| 2,718,613 | Harris | Sept. 20, 1955 |
| 2,724,061 | Emery | Nov. 15, 1955 |
| 2,731,201 | Harper | Jan. 17, 1956 |
| 2,771,550 | Hampton | Nov. 20, 1956 |
| 2,771,551 | Hampton | Nov. 20, 1956 |
| 2,820,153 | Woll | Jan. 14, 1958 |
| 2,831,983 | Ostendorf | Apr. 22, 1958 |

FOREIGN PATENTS

| | | |
|---|---|---|
| 584,422 | Great Britain | Jan. 14, 1947 |
| 1,098,225 | France | Mar. 2, 1955 |

OTHER REFERENCES

The Transistor, prepared by Bell Telephone Laboratories, Inc., for Western Electric Co., Inc., Dec. 4, 1951; article by R. E. Yeager, entitled "A Gray to Binary Translator and Shift Register," pp. 612–27, Fig. 8, page 624 relied upon.

Proceedings of the IRE, vol. 41, No. 10, October 1953, "Electronic Circuits of the NAREC Computer," by P. C. Sherertz, pages 1313–1320, Figs. 8 and 9 at page 1317 pertinent.